United States Patent
Lee et al.

(10) Patent No.: US 8,697,520 B2
(45) Date of Patent: Apr. 15, 2014

(54) METHOD OF FORMING AN ASYMMETRIC POLY GATE FOR OPTIMUM TERMINATION DESIGN IN TRENCH POWER MOSFETS

(75) Inventors: Yeeheng Lee, San Jose, CA (US); Yongping Ding, San Jose, CA (US); Xiaobin Wang, San Jose, CA (US)

(73) Assignee: Alpha & Omega Semiconductor Incorporationed, Sunnyvale, CA (US)

( * ) Notice: Subject to any disclaimer, the term of this patent is extended or adjusted under 35 U.S.C. 154(b) by 167 days.

(21) Appl. No.: 13/411,422

(22) Filed: Mar. 2, 2012

(65) Prior Publication Data
US 2013/0228857 A1 Sep. 5, 2013

(51) Int. Cl.
*H01L 21/336* (2006.01)

(52) U.S. Cl.
USPC ........... 438/272; 438/430; 438/589; 257/330; 257/E21.629

(58) Field of Classification Search
USPC .......... 438/272, 430, 400; 257/334, E21.629, 257/E21.419
See application file for complete search history.

(56) References Cited

U.S. PATENT DOCUMENTS

| | | | |
|---|---|---|---|
| 5,877,529 A | 3/1999 | So et al. | |
| 6,388,286 B1 | 5/2002 | Baliga | |
| 7,557,395 B2 | 7/2009 | Ma et al. | |
| 7,745,878 B2 | 6/2010 | Bhalla et al. | |
| 7,936,011 B2 | 5/2011 | Bhalla et al. | |
| 7,982,265 B2 | 7/2011 | Challa et al. | |
| 7,989,887 B2 | 8/2011 | Hsieh | |
| 8,053,315 B2 | 11/2011 | Tai et al. | |
| 8,058,687 B2 | 11/2011 | Tai et al. | |
| 8,138,605 B2 | 3/2012 | Chang et al. | |
| 2010/0140689 A1* | 6/2010 | Yedinak et al. | 257/330 |
| 2010/0140695 A1* | 6/2010 | Yedinak et al. | 257/334 |
| 2010/0140696 A1* | 6/2010 | Yedinak et al. | 257/334 |
| 2010/0140697 A1* | 6/2010 | Yedinak et al. | 257/334 |
| 2011/0039383 A1 | 2/2011 | Chen et al. | |
| 2011/0121386 A1* | 5/2011 | Hsieh | 257/334 |
| 2011/0177662 A1* | 7/2011 | Yilmaz et al. | 438/270 |
| 2011/0212586 A1* | 9/2011 | Grebs et al. | 438/270 |
| 2011/0220990 A1 | 9/2011 | Chang et al. | |
| 2012/0132988 A1* | 5/2012 | Lui et al. | 257/334 |
| 2013/0001683 A1* | 1/2013 | Pan et al. | 257/334 |
| 2013/0105886 A1 | 5/2013 | Lui et al. | |

OTHER PUBLICATIONS

R. Siemiemiec, F. Hirler, C. Geissler, "Space-saving edge-termination structures for vertical charge compensation devices", Power Electronics and Applications, 2009. EPE '09. 13th European Conference on Sep. 8-10, 2009 in Barcelona Spain.

* cited by examiner

*Primary Examiner* — Stephen W Smoot
*Assistant Examiner* — Pavel Ivanov
(74) *Attorney, Agent, or Firm* — Kenneth C. Brooks

(57) ABSTRACT

A semiconductor device having a plurality of transistors includes a termination area that features a transistor with an asymmetric gate.

21 Claims, 13 Drawing Sheets

US 8,697,520 B2

METHOD OF FORMING AN ASYMMETRIC POLY GATE FOR OPTIMUM TERMINATION DESIGN IN TRENCH POWER MOSFETS

BACKGROUND OF THE INVENTION

This invention relates to field effect transistors and more particularly to power metal oxide semiconductor field-effect transistor (MOSFET) having improved device edge termination characteristics.

Power electronic applications typically employ a power metal-oxide-semiconductor field effect transistor (MOSFET). Power MOSFETs are desired to sustain a relatively high breakdown voltage, while having a desirable low on-resistance. Typically, power MOSFET devices are formed from a clustered array of transistors fabricated on a substrate referred to as an active area.

Surrounding the active area is a region into which electric fields produced in the active area distribute. This is referred to as a termination area. It is desirable to maximize the breakdown voltage of the power MOSFET, a in the termination region beyond that of the active cell region. If termination breakdown voltage is lower than that of active region, the avalanche current will crowd into termination region and result in lower avalanche capability. In most applications, highest possible avalanche current is most desired.

In a conventional Shielded Gate Transistor (SGT) MOSFET, the termination region design is most challenging since the last active cell trench, which borders the termination region, behaves differently compared with the ones inside of the active region.

There is a need, therefore, to provide suitable termination region design to maximize the breakdown voltage of the power MOSFET.

A semi conductor device having a plurality of transistors includes a termination area that features a transistor with an asymmetric gate. The semiconductor device includes an active area having a plurality of active transistors each of which has source, drain and gate regions. The source and gate regions are spaced-apart and are electrically insulated from each other. The termination area surrounds the active area. The termination area includes a plurality of spaced-apart termination trenches, each filled with an electrically conductive material and an electrically insulative material. The electrically insulative material is disposed between the electrically conductive material and the conductive material of the substrate. One of the plurality of termination trenches is disposed between the active area and the remaining trenches of the plurality of termination trenches, in which a gate region is formed in superimposition and spaced-apart with a shielded gate region such that a cross-sectional area of the gate poly is less than a cross-sectional area of the gate region in a transistor forming an asymmetric gate. Also disclosed is a method for forming the semiconductor device. These and other embodiments are discussed more fully below.

DETAILED DESCRIPTION OF THE INVENTION

Figure 1:
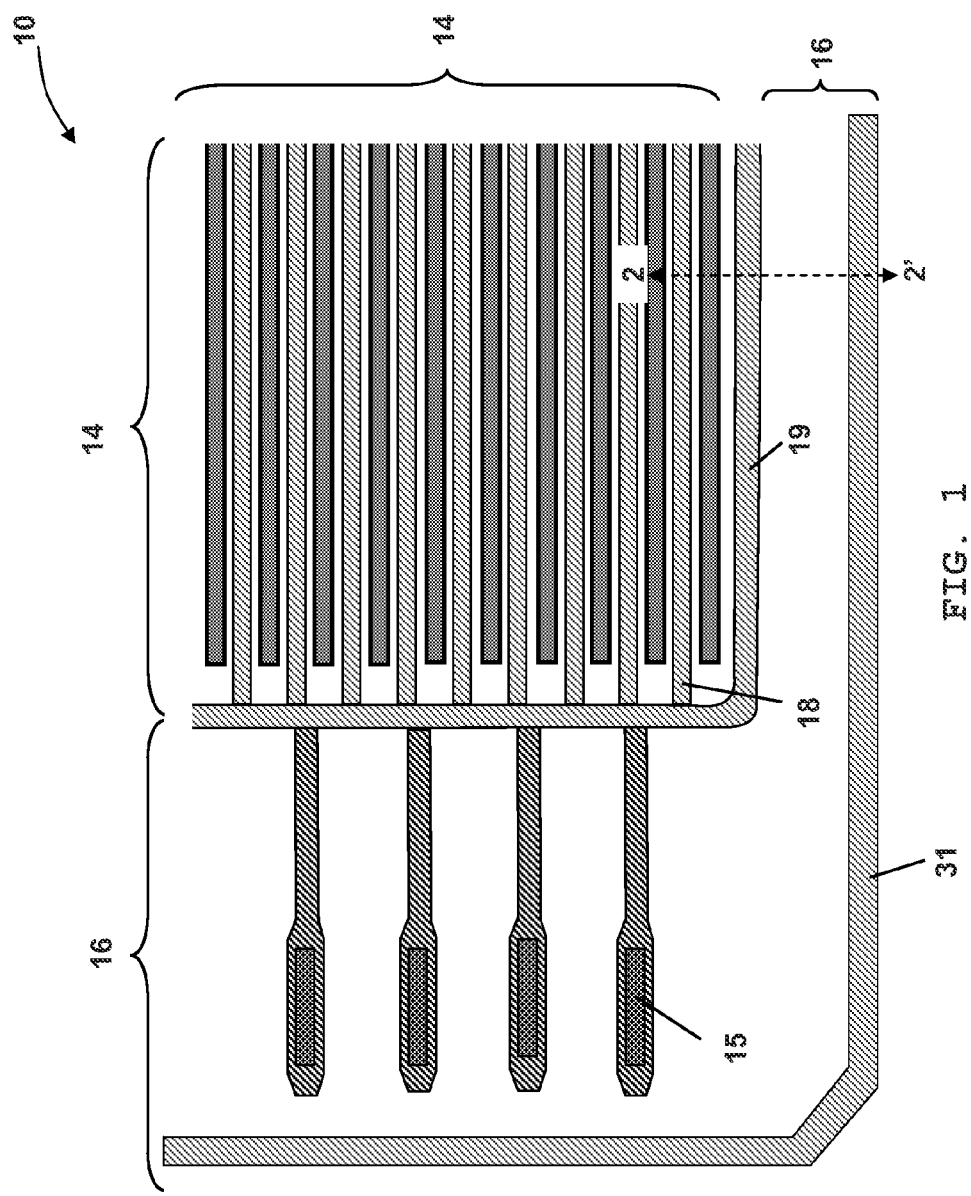
FIG. 1 is a top down view of the semiconductor device in accordance with the present invention.
Figure 2A:
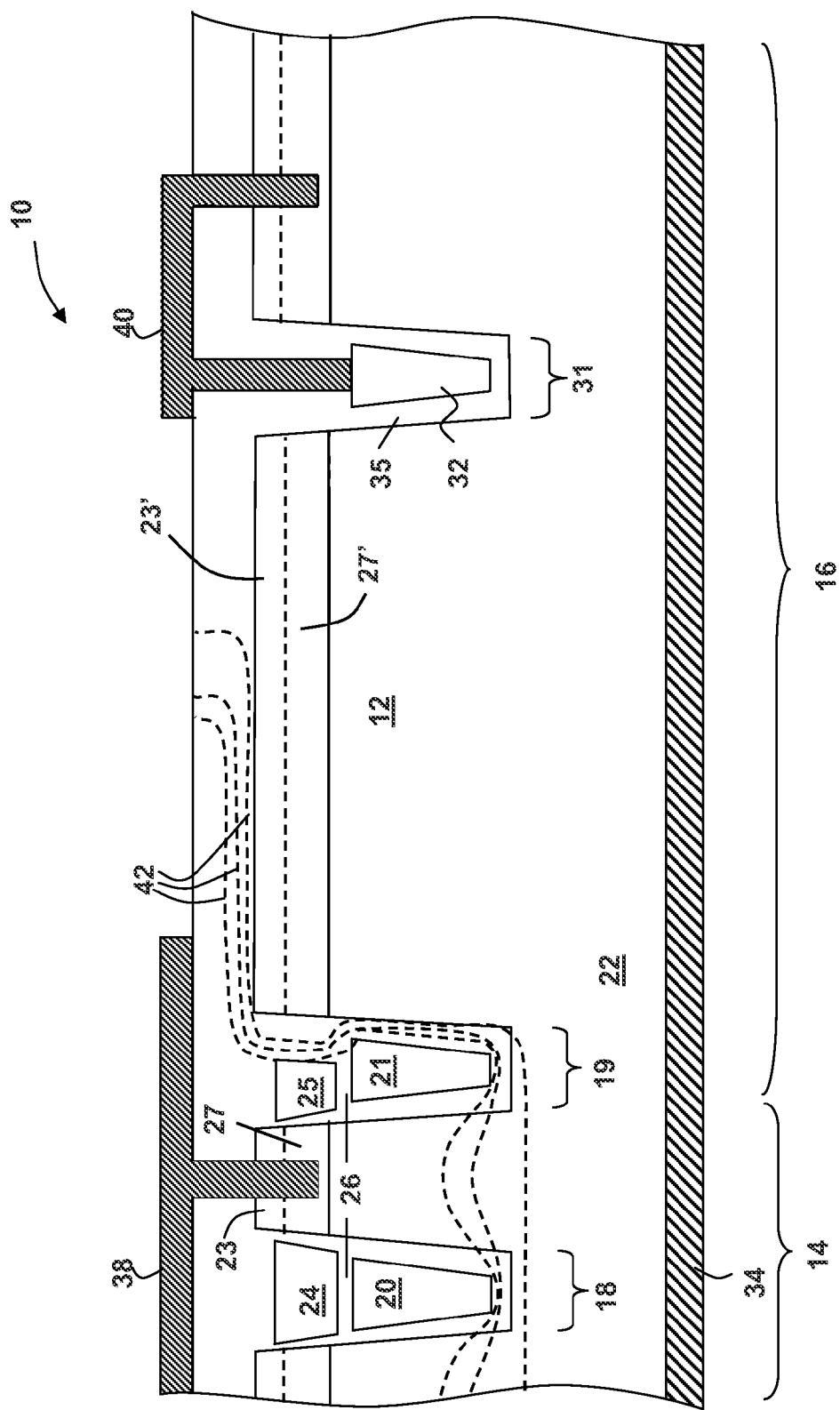
FIG. 2A is a side view of the semiconductor device shown in FIG. 1 taken along line 2-2

Referring to both FIGS. 1 and 2A, respectively a partial layout and cross section along line 2-2', a semiconductor device 10 is formed on a semiconductor substrate 12 that includes an active area 14 and a termination area 16, surrounding active area 14. Substrate 12 may comprise an epitaxial layer doped with either N-type or P-type impurities of various dopant concentrations of about 1e13 cm$^{-3}$ to 1e8 cm$^{-3}$ on top of a heavily dope N+ or P+ semiconductor layer (not shown). Active area 14 includes a plurality of field effect transistors with gate formed in a plurality of active trenches one of which is shown as 18. Each transistor includes a source region 23, a body region 27a, drain region 22, a trenched insulated gate region 24 and a shielding gate region 20 disposed in the lower portion of the active trench 18 below the gate region 24. Gate region 24 and shielding gate region 20 are made of electrically conductive materials, for example doped polysilicon, and are electrically insulated by an electrically insulative material 26 disposed therebetween. As shown in FIG. 2A, source dopant with the same conductivity type as the substrate and the body dopant with opposite conductivity type of the substrate are implanted into the upper surface of the entire active area forming source regions 23 and body regions 27 and the entire termination area forming source dopant region 23' and body dopant region 27'. Each source and body region in the active area is electrically connected to a source metal layer 38 disposed on top of the substrate, while the source dopant regions and the body dopant regions in the termination area may be floating.

Termination area 16 includes at least an innermost termination trench 19 adjacent the active area 14 and an outermost termination trench 31 spaced apart from the innermost termination trench 19. Trench 19 is disposed between active area 14, or last transistor active trench 18, and trench 31. Preferably trench 19 has the same width and depth as trench 18. Trench 31 is filled with electrically conductive material 32 and electrically insulative material 35. Electrically conductive material 32 may be any suitable electrically conductive material. In the present example, electrically conductive material is doped polysilicon. Electrically insulative material 35 may be any suitable electrically insulative material. In the present example, electrically insulative material 35 is silicon oxide. Electrically conductive material 32 is surrounded by electrically insulative material 35, with electrically conductive material 32, disposed within trench 31 which is electrically connected through metal connection 40 to a body dopant region 27' next to the outermost termination trench and further away from the innermost termination trench and the active area. The source and body dopant regions 23' and 27' next to the outmost termination trench and further away from the active area may extend to the scribe line that defines the edge of semiconductor substrate.

Similar to the active trench 18, the electrically conductive material 21 disposed in trench 19 functions as a shielding gate of transistor 19. A gate region 25 formed from an electrically conductive material is disposed in superimposition with and spaced-apart from the shielding gate 21 by electrically insulative material 26. A drain contact 34 is in electrical communication with drain region 22. A gate contact in electrical communication with gate regions 24 and 25 may be pickup at a separate location 15 in termination are 16 as shown in FIG. 1 which shows the active trench 18 and the innermost termination trench 19 are interconnected with each other while the outmost termination trench 31 does not interconnected with any other trenches. The shielding gate 20 and 21 respectively in active trench 18 and the innermost termination trench 21 are interconnected in the same fashion and may electrically connected to the source metal 38 in the third dimension (not shown) or a separate electrode as in the embodiment of FIG. 3 to be described later.

Unlike gate region 24 which is substantially symmetrically disposed within the active gate trench 18 with a gate dielectric layer of same thickness insulating on both sides of the gate region 24 from the body regions 27, gate region 25 is asymmetrically disposed within the trench 19 with a first dielectric layer thickness same as the active gate dielectric layer insulating gate region 25 from the body region 27 adjacent the gate region 25 and a second dielectric layer thickness much thicker than the active gate dielectric layer insulating the gate region 25 from the body dopant region 27' adjacent the gate region 25. Gate region 25 may have a cross sectional area that is asymmetric and/or smaller than the cross-sectional area of active gate region 24. The benefit of the asymmetric gate region 25 in the innermost termination trench 19 is that the last active transistor mesa between the active gate trench 18 and the innermost termination trench 19 behaves the same as other active transistor mesa regions due to the presence of the gate region 25 in the innermost termination trench 19; the thicker insulation layer insulating the gate region 25 in the termination trench 19 can be adjust to optimize the distribution of electric fields 42 such that maximum Breakdown voltage is achieved. This may be compared with semiconductor device 110, shown in FIG. 3.

Figure 3:
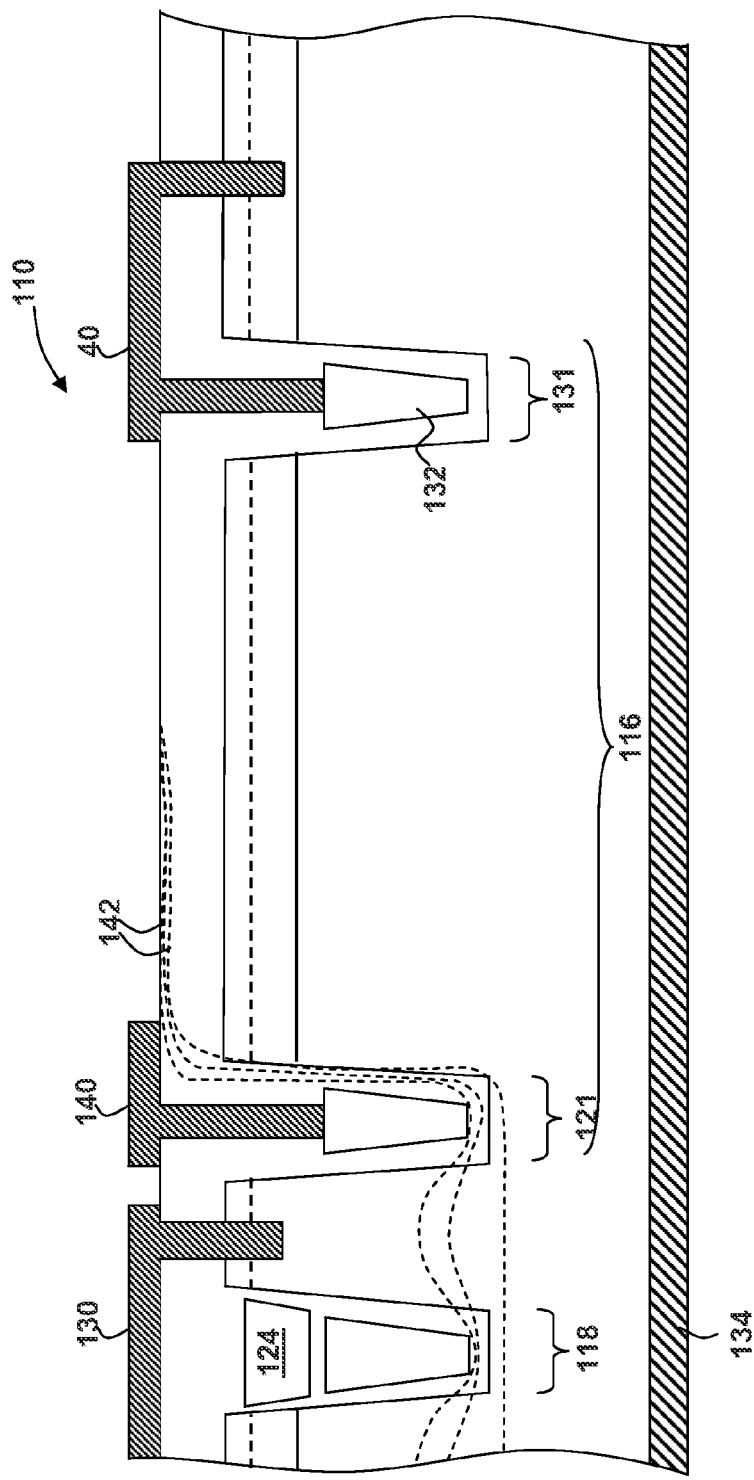
FIG. 3 is a side view of a semiconductor device in accordance with another embodiment of present invention.

Referring to both FIGS. 2A and 3, semiconductor device 110 includes a transistor 118 in the active area that is substantially similar to transistor 18. The termination area 116 includes termination trenches 121 and 131. As shown in FIG. 3, the last active transistor mesa as only one channel next to the gate 124. No channel can be established on the side of the transistor mesa next to the termination trench 121 because of the absence of gate in trench 121 therefore the last active transistor mesa in FIG. 3 may behave differently from the other active transistor mesas inside the active area leading to early breakdown of the device. This is undesirable for the reasons mentioned above. By carefully adjusting the thickness of oxide that separates the gate region 25 from the semiconductor mesa in termination region 16, the electrical filed 42 in FIG. 2A can be adjust to be substantially identical to the electrical filed 143 in FIG. 3 such that the asymmetric gate region 25 is provided without affecting the performance of termination area 16.

Figure 2B:
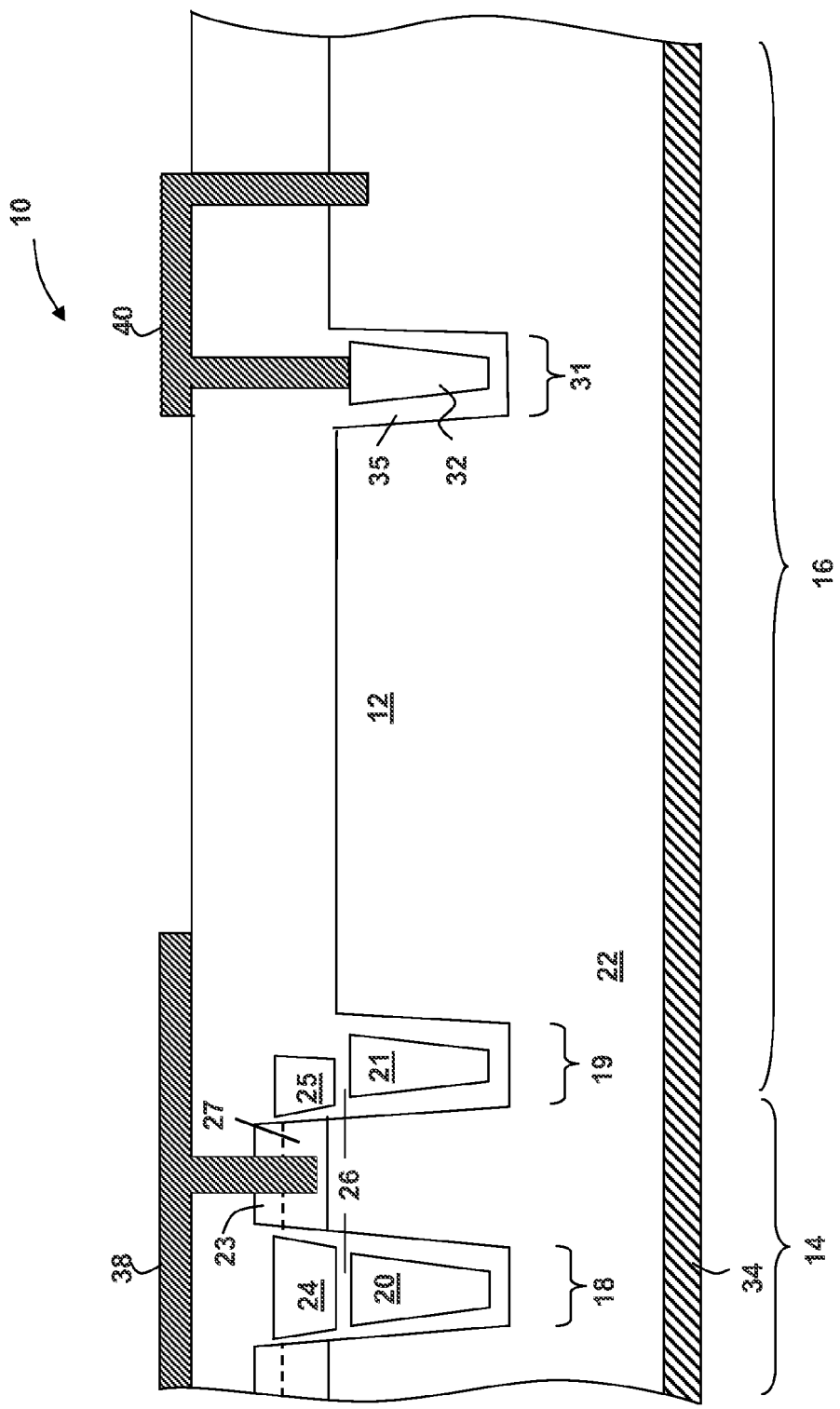
' FIG. 2B is a side view of the semiconductor device shown in FIG. 1 taken along line 2-2' according to another embodiment of present invention.

FIG. 2B is another embodiment according to this invention. The device in FIG. 2B is substantially the same as FIG. 2A except that in termination area, a top portion of the substrate has been removed in the entire termination area such that the top surface of substrate in the termination area is recess at least to the bottom of the gate region 25. The electrically conductive material 32 disposed within trench 31 is electrically connected to the substrate in the termination area since both the source and body dopant regions 23' and 27' in FIG. 2A are now removed.

Referring to FIGS. 2A, 2B and 3, another benefit with device 10 is that it may be manufactured employing several steps that are common with steps employed to produce device 110, differing only in the patterning of the substrate, with only 5 masks used instead of 6 masks in currently known method.

Figure 4:
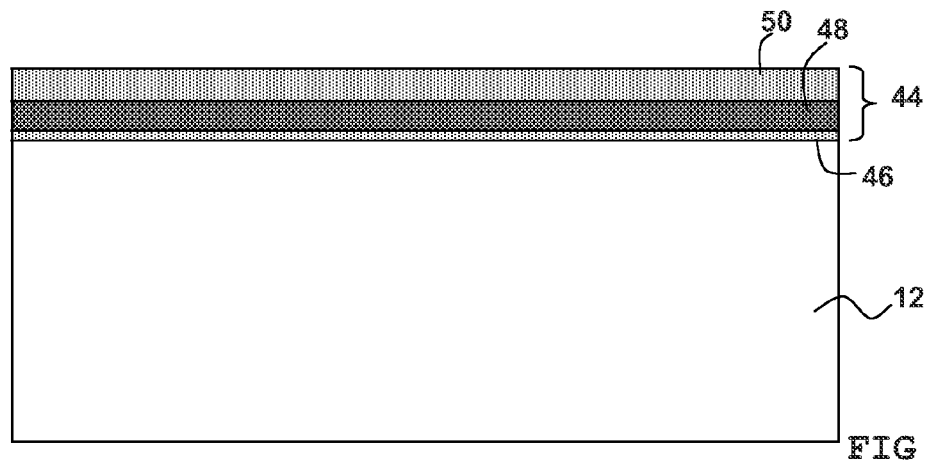
FIGS. 4-21 are cross-sectional views the semiconductor device shown in FIGS. 1 and 2 during different processing steps.
Figure 5:
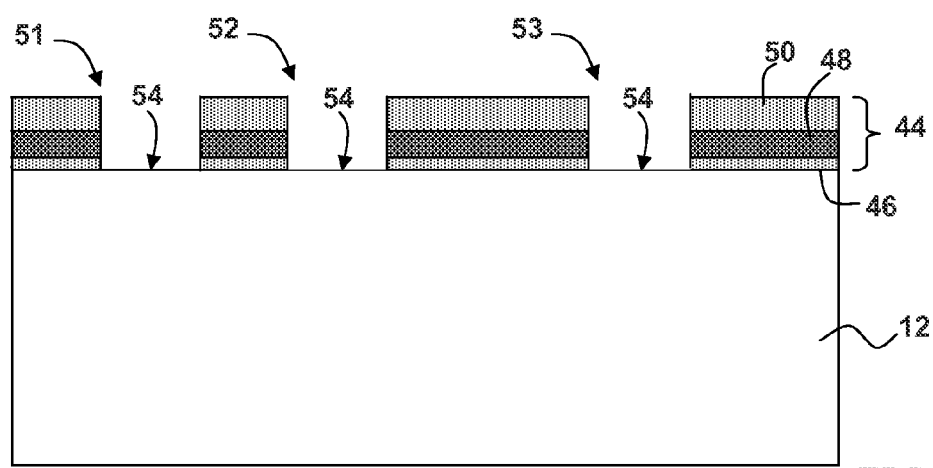

As shown in FIG. 4, initially, device 10 is manufactured by depositing on substrate 12, an ONO stack 44, using standard deposition techniques to fabricate the oxide layer 46, nitride layer 48, oxide layer 50 of ONO stack 44. As shown, the thickness of oxide layer 46 is 100 A to 500 A, typically 200 A, which is formed by thermal oxidation or by Chemical Vapor Deposition (CVD); the thickness of nitride layer 48 is 500 A to 3000 A, typically 1800 A, which is formed by LPCVD or plasma-enhanced chemical vapor deposition (PECVD); and the thickness of oxide layer 50 is 1000 A to 10000 A, typically 6000 A, which is formed by LPCVD or PECVD. Following deposition of ONO stack 44, the same is patterned and subjected to a standard patterning and etch processes to form a plurality of openings 51, 52 and 53, exposing surface 54 of substrate 12, shown in FIG. 5.

Figure 6:
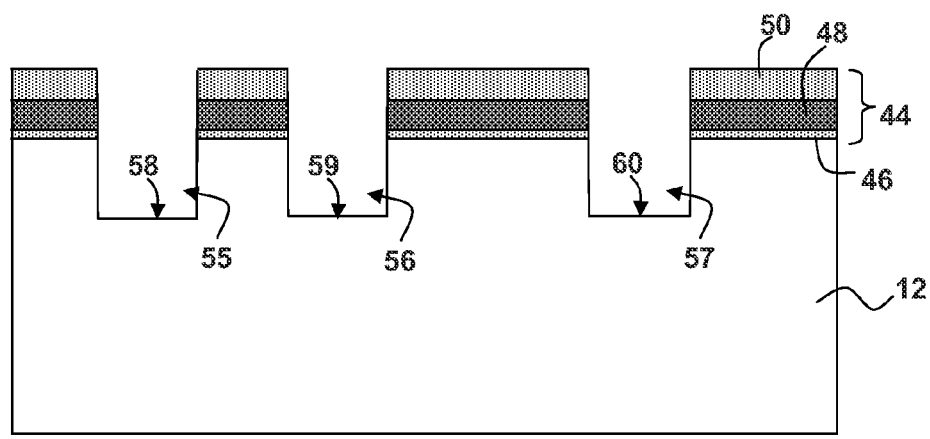
Figure 7:
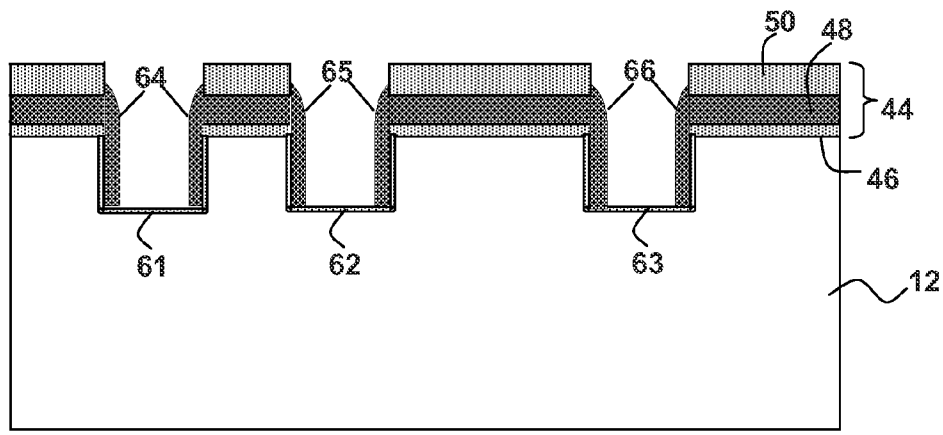

Following formation of openings 51, 52 and 53, a selective etch process is employed, typically an anisotropic dry etching including RIE to form trenches 55, 56 and 57 that extend from openings 51, 52 and 53, respectively, terminating on surfaces 58, 59 and 60, respectively with a trench depth of 0.5 micron to 4 microns, typically 1 micron, shown in FIG. 6. Following formation of trenches 55, 56 and 57, a pad oxide 61, 62 and 63, respectively, is formed therein by thermal oxidation or LPCVD with a thickness of about 50 A to 500 A, typically 250 A, shown in FIG. 7. Formed atop of each pad oxide 61, 62 and 63, at the sidewall of the trenches 55, 56 and 57, is a nitride spacer, 64, 65 and 66 respectively of a thickness of 500 A to 3000 A, typically 1800 A, by LPCVD or PECVD deposition and subsequent anisotropic dry etching. Each nitride spacer 64, 65, 66 extends from oxide layer 50 toward substrate 12.

Figure 8:
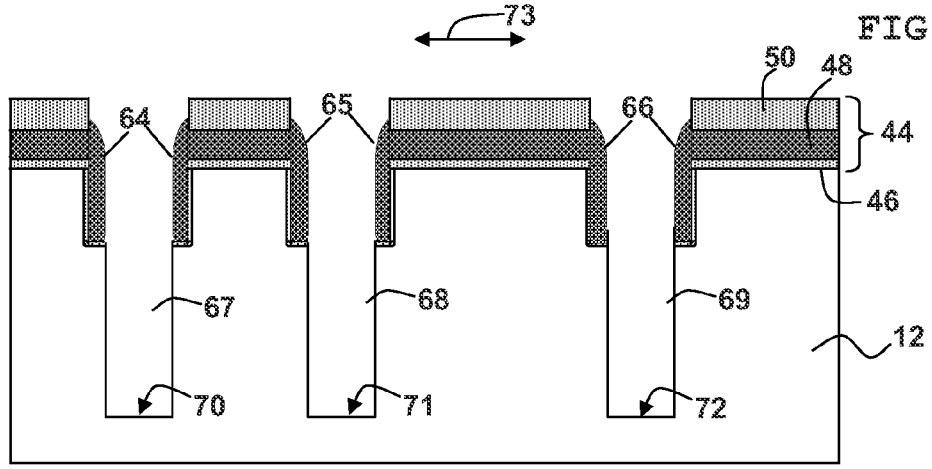
Figure 9:
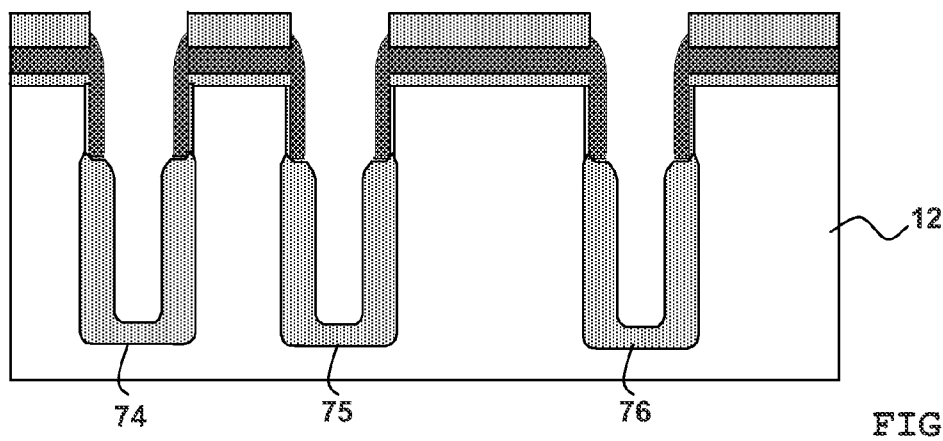
Figure 10:
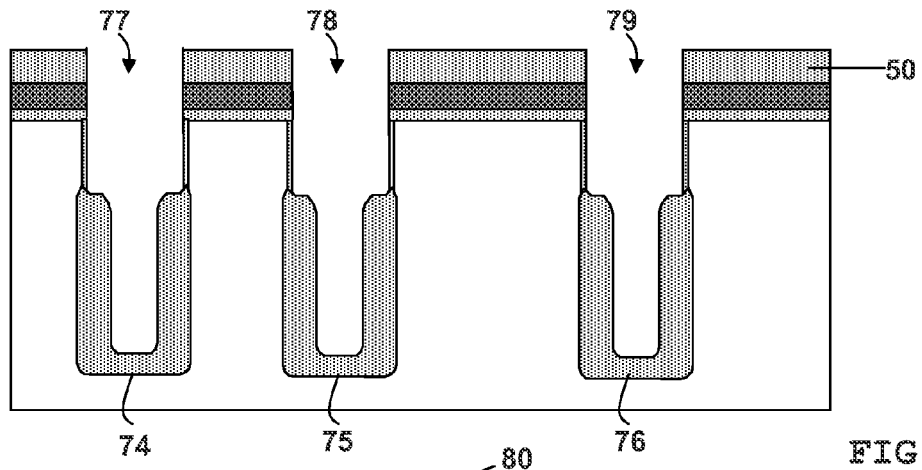

Following formation of nitride spacers 64, 65 and 66, a selective etch process, typically anisotropic dry etching, is employed to form trenches 67, 68 and 69. Trenches 67, 68 and 69 extend from nitride spacers 64, 65 and 66, respectively, terminating on a surface, 70, 71 and 72, respectively, with a trench depth of 0.5 micron to 8 microns, typically 3 microns, shown in FIG. 8. Nitride spacers 64, 65 and 66 form an etch stop so as to define a width of each of trenches 67, 68 and 69, with the width being measured parallel to a direct of line 73. Following formation of trenches 67, 68 and 69 a thermal process to provide oxide growth in regions 74, 75 and 76 of substrate 12 at the sidewalls of trenches 67, 68 and 69 not covered by the nitride spacer 64, 65 and 66, shown in FIG. 9. The thickness of the oxide 74, 75 and 76 is about 500 A to 10000 A, typically 5000 A. The oxide regions 74, 75 and 76 can be formed with a standard wet oxidation. After formation of oxide regions 74, 75 and 76, nitride spacers 64, 65 and 66 are exposed to a conventional wet etch and is removed, leaving trenches 77, 78 and 79, shown in FIG. 10.

Figure 11:
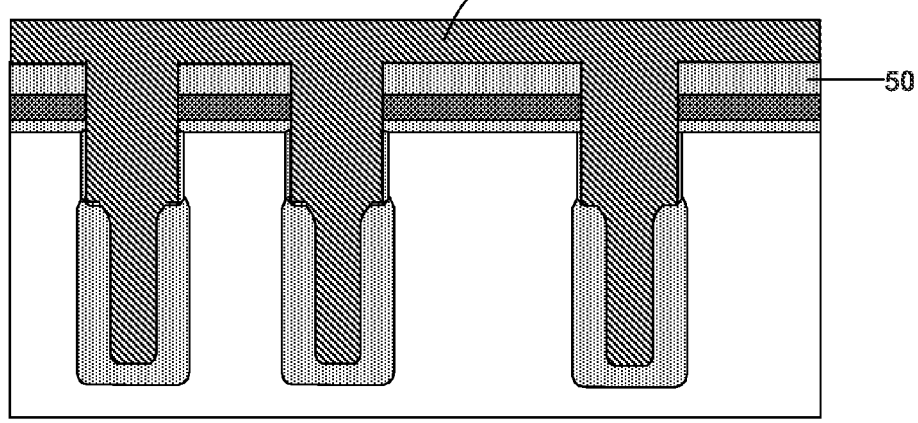

A layer 80 of heavily doped polysilicon, for example in-situ Phosphorus doped poly 1, is deposited, for example by CVD, to cover oxide layer 50 and fill in the trenches 77, 78 and 79 of a thickness of 4000 A to 15000 A, typically 8000 A, shown in FIG. 11. A top portion of polysilicon layer 80 is removed using a selective etch technique, for example a standard Poly dry etchback process, leaving polysilicon plugs 81, 82 and 83, each of which is surrounded by one of oxide regions 74, 75 and 76 respectively at one end with the top surface of plugs 81, 82 and 83 being in a common plane with the top surface of oxide regions 74, 75 and 76, respectively, forming a non-homogenous surface 84, 85 and 86 of trenches 87, 88 and 89, shown in FIG. 12.

Figure 13:
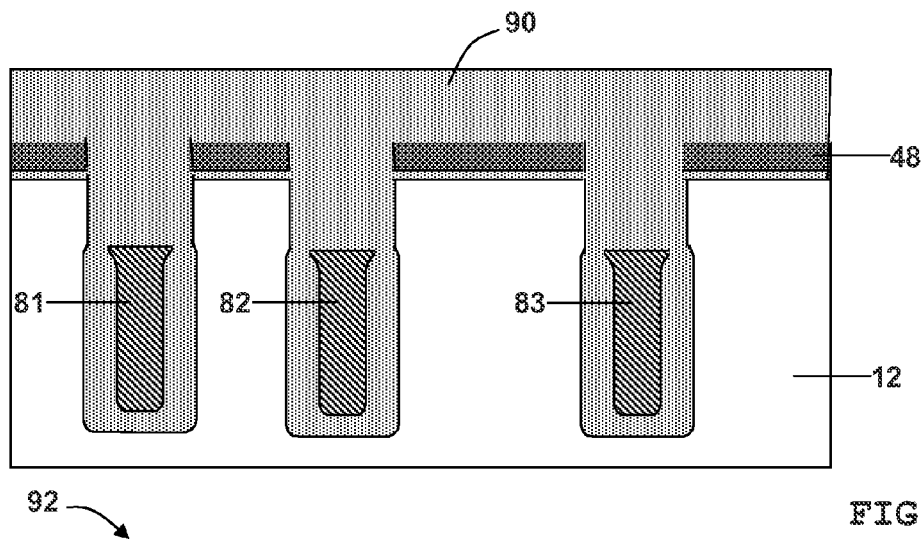

A silicon oxide layer 90 is formed upon substrate 12 that includes oxide layer 50 and oxide regions 74, 75 and 76 and fills trenches 87, 88 and 89 of a thickness of 4000 A to 20000 A, typically 18000 A, by LPCVD or PECVD as shown in FIG. 13. In this manner silicon oxide layer 90 encapsulates plugs 81, 82 and 83. Silicon oxide layer 90 is subjected to a chemical mechanical process (CMP) that completely remove top regions of oxide layer 90, as well as a substantially portion of nitride layer 48, leaving structure 92 with exposed nitride layer 48, shown in FIG. 14.

Figure 12:
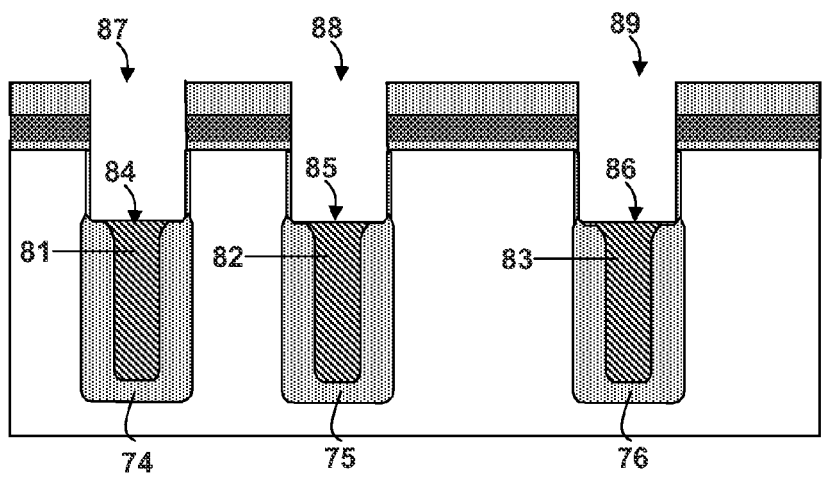
Figure 14:
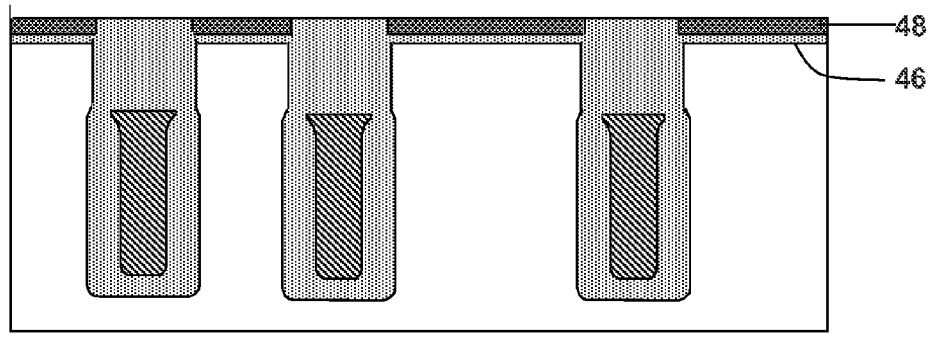
Figure 15:
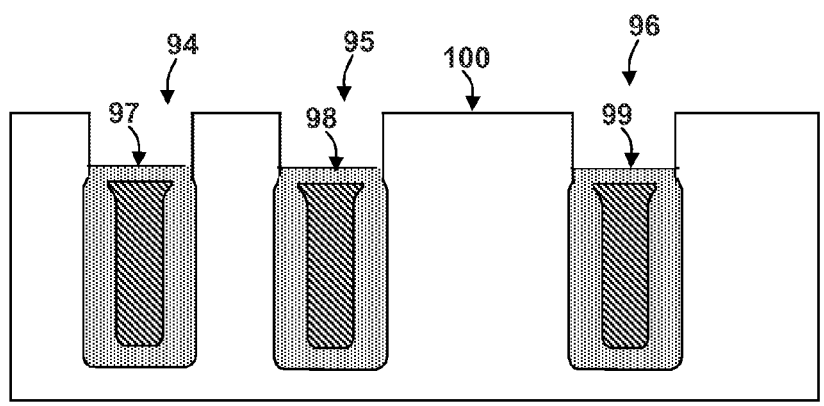
Figure 16:
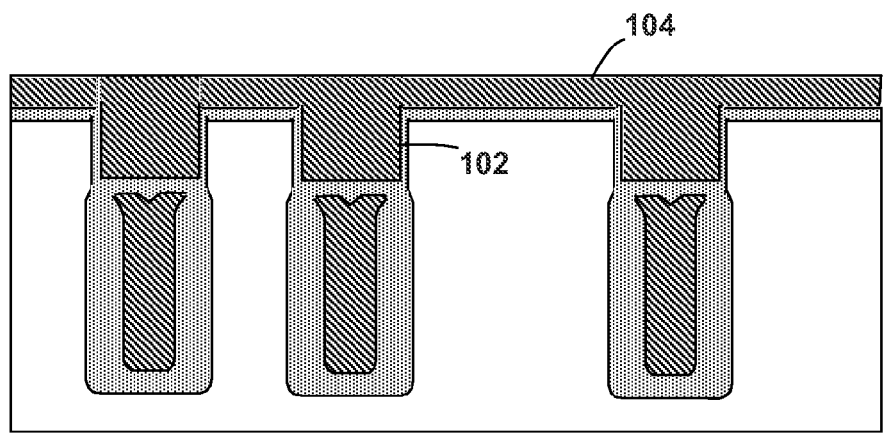

Referring to FIGS. 12, 14 and 15, structure 92 is subjected to a wet etch technique to remove the remaining portions of nitride layer 48, as well as oxide layer 46 atop of substrate 12 and top portions of oxide layer 90 in the trenches 87, 88 and 89 to a predetermined depth below the top surface of the substrate 12 and above the surfaces 84, 85 and 86, leaving trenches 94, 95 and 96, respectively. Trenches 94, 95 and 96 each includes a oxide region 97, 98 and 99 formed from the remaining portions of oxide layer 90 surrounding polysilicon plugs 81, 82 and 83. In this manner, surface 100 of substrate 12 is exposed. A gate oxide layer 102 is formed over surface 101 and on sidewalls of trenches 94, 96 and 97, as well as surfaces 97, 98 and 99. A layer of polysilicon 104, for example in situ Phosphorus doped poly 2, is deposited so as to cover oxide layer 102 and fill in the remaining portions of trenches 94, 95 and 96, shown in FIG. 16, which is subsequently etched back to the surface of the gate oxide 102. In this manner, only portions 105, 106 and 107 of polysilicon layer 104 remain, with regions of oxide layer 102 in superimposition with surface 100 being exposed. Body region 103 followed by source region 101 are formed by blanket implantation, shown in FIG. 17.

Figure 17:
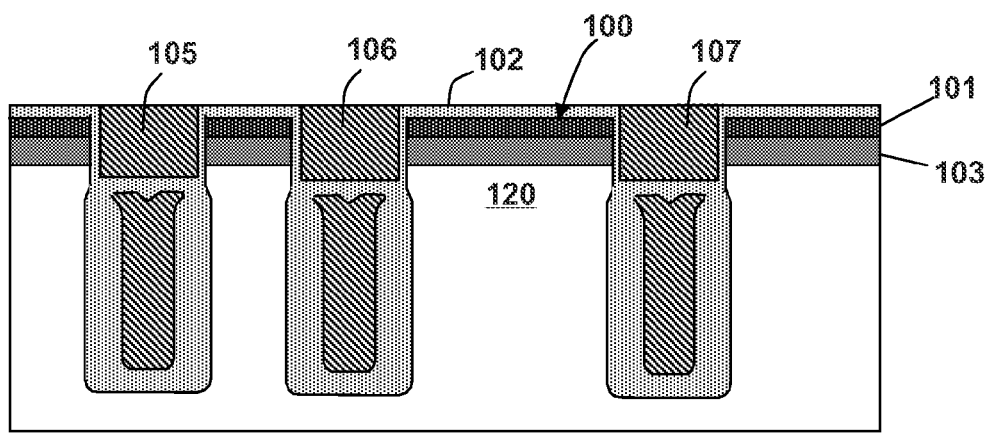
Figure 18:
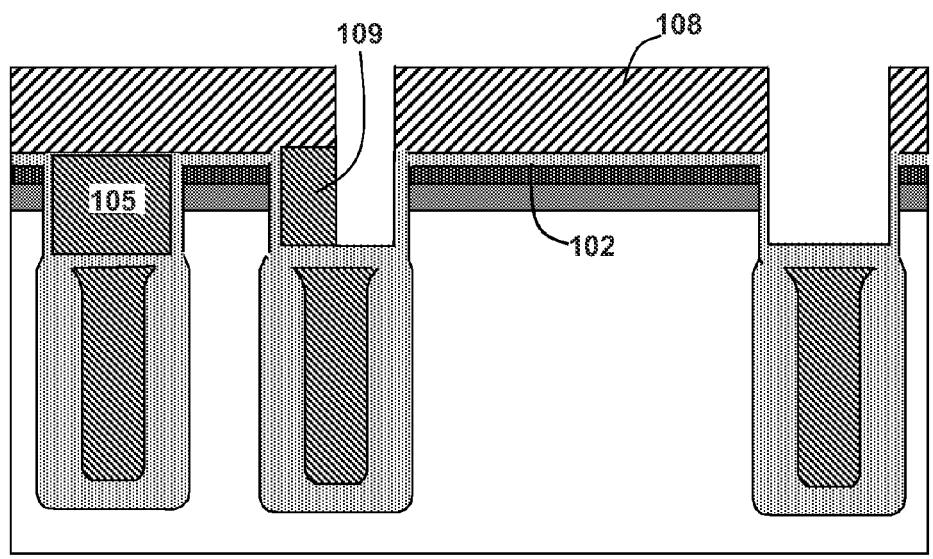
Figure 19:
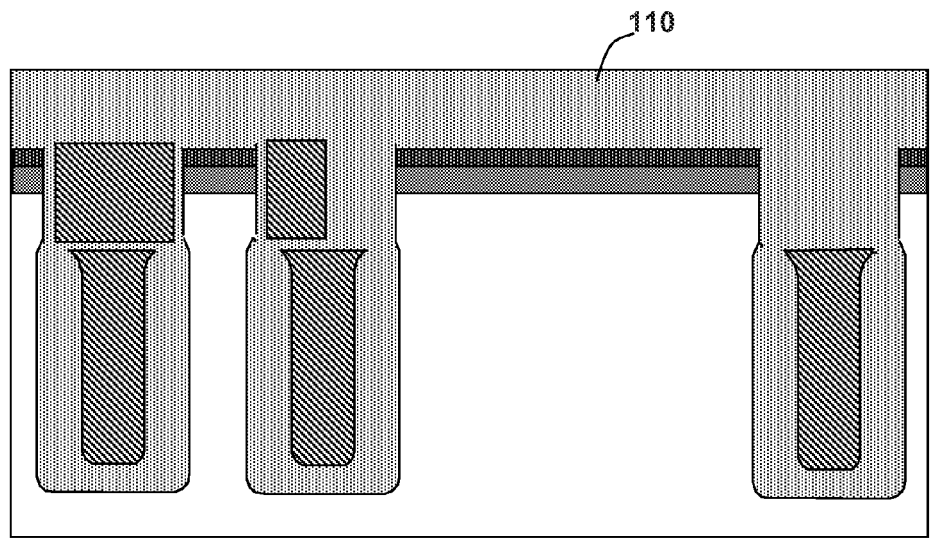
Figure 20:
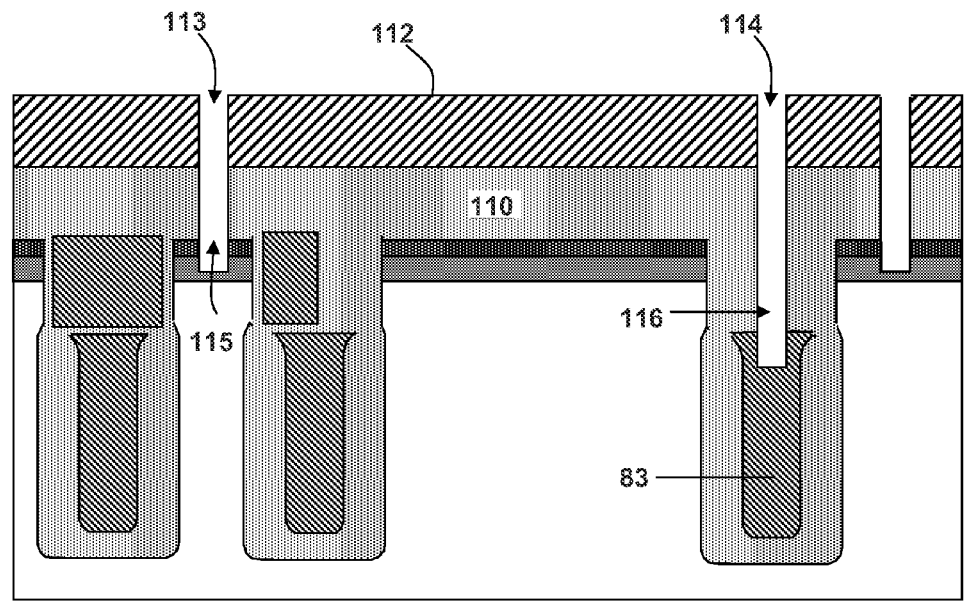
Figure 21:
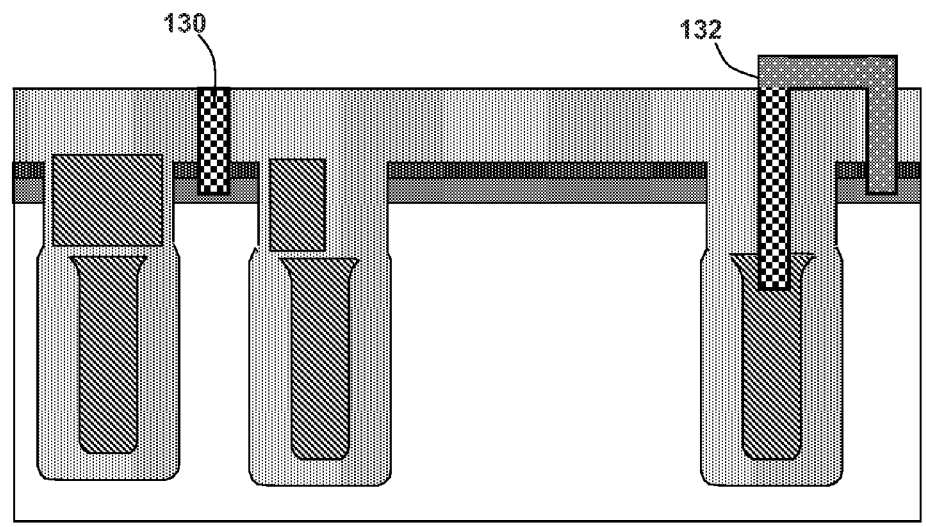

Referring to both FIGS. 17 and 18, portions 106 and 107 are subjected to an etch process to completely remove portion 107 and part of portion 106, which is furthest from portion 105, for example by a standard anisotropic dry etching. To that end, a patterned photo-resist layer 108 is deposited to completely cover gate oxide layer 102 and portion 105, as well as a part 109 of portion 106 closest to portion 105. After etching of portions 106 and 107, photo-resist layer 108 is removed and an electrically insulative layer 110, for example a low temperature oxide (ITO) and/or a boron phosphorous silicon glass (BPSG), is deposited atop the substrate, as shown in FIG. 19. Following formation of the insulative layer 110 a patterned photo-resist layer 112 is formed on top of the insulative layer 110 and patterned with contact openings 113 and 114. Following formation of openings 113 and 114 a suitable etching process is performed to generate vias 115 and 116 into insulative layer 110, as well as a top portion of polysilicon plug 83 through the opening 114 and into the source layer 101 and a top portion of body layer 103 through the opening 113, shown in FIG. 20. Photo-resist layer 112 is subsequently removed and barrier metal and metal plugs 130 and 132, for example Tungsten (W) plugs, are formed in vias 115 and 116, which are subsequently placed in electrical communication with contacts 38 and 40 shown in FIG. 2, shown in FIG. 21.

Figure 22:
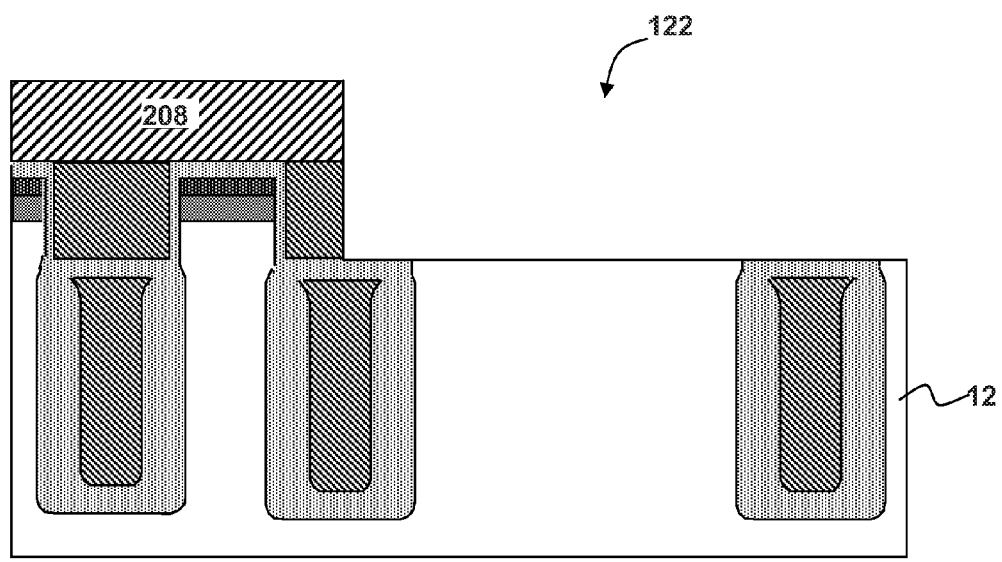
FIGS. 22-25 are cross-sectional views the semiconductor device shown in FIGS. 1 and 2 during different processing steps.

Referring to both FIGS. 18 and 22, it should be understood that the foregoing is merely one manner in which to fabricate a semiconductor device having the advantages of semiconductor device 10. For example, following the etching back of the polysilicon layer 104 and the formation of body layer 103 and source layer 101, photo-resist layer 108 may be patterned to cover only portion 105 and part 109 of region 106, shown by photo-resist layer 208. Following formation of photo-resist layer 208, gate oxide layer 102, source and body layers 101, 103 and top portions 120 of substrate 12, as well as a portion of region 106 adjacent to part 109 and the entire region 107 are subjected to suitable etch processes to completely remove the same, for example a standard anisotropic dry etching. In this manner, a stepped structure 122 remains upon substrate 12.

Figure 23:
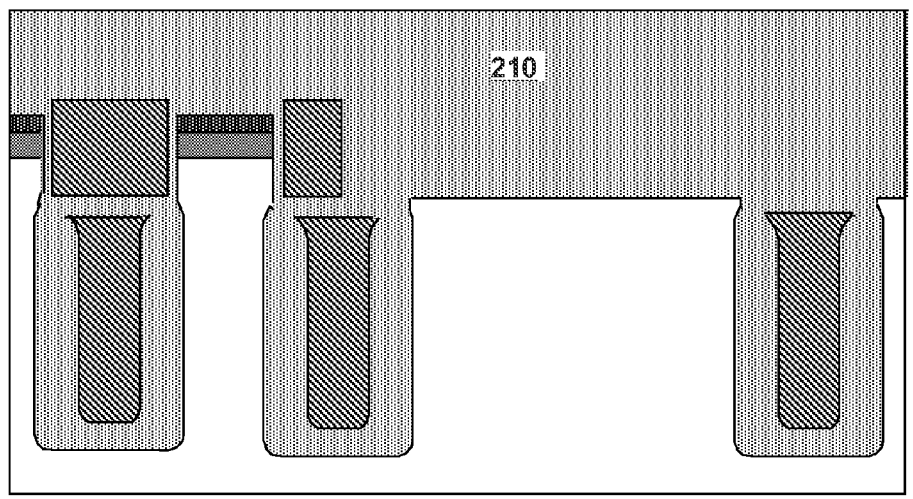
Figure 24:
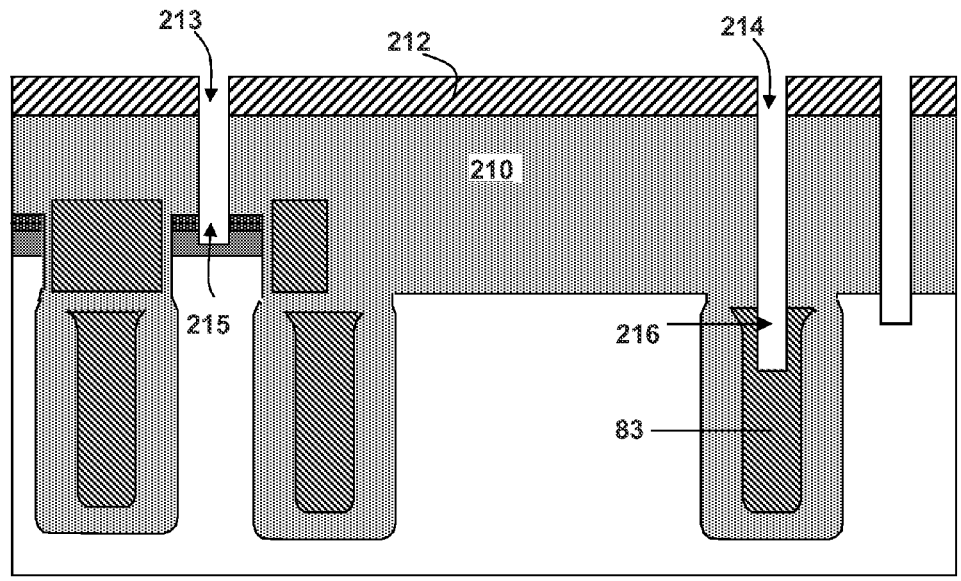
Figure 25:
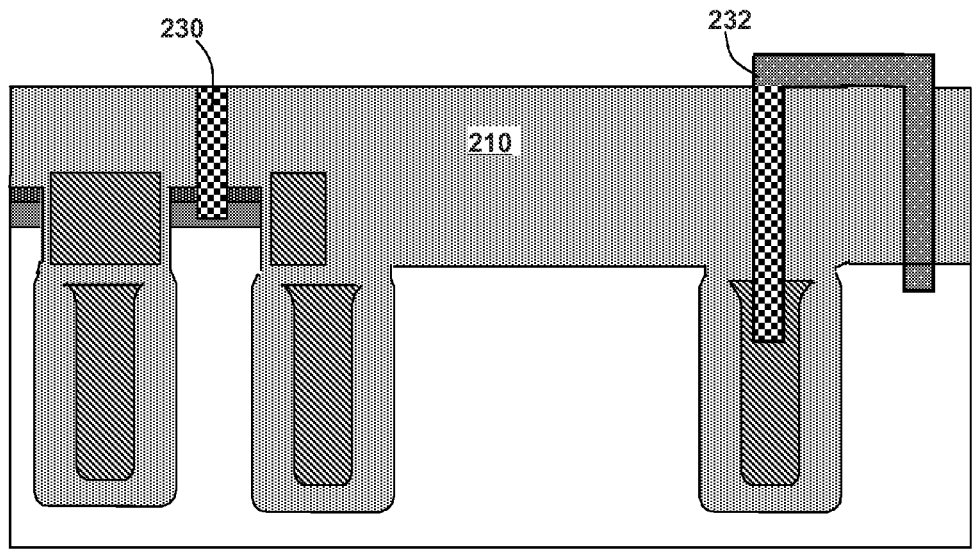

After formation of stepped structure 122 an electrically insulative layer 210, for example a low temperature oxide (LTO) and/or a boron phosphorous silicon glass (BPSG), is deposited atop the substrate 12, shown in FIG. 23. Following formation of insulative layer 210 a photo-resist layer 212 is formed upon insulative layer 210 and patterned to have contact openings 213 and 214. Following formation of openings 213 and 214 a suitable etching process is performed to generate vias 215 and 216 into insulative layer 210, as well as a top portion of polysilicon plug 83 through the opening 214 and into the source layer 101 and a top portion of body layer 103 through the opening 213, shown it FIG. 24. Photo-resist layer 212 is subsequently removed and barrier metal and metal plugs 230 and 232, for example Tungsten (W) plugs, are formed in vias 215 and 216, which are subsequently placed in electrical communication with contacts in a manner similar to contacts 38 and 40 shown in FIG. 2.

It should be understood that the foregoing description is merely an example of the invention and that modifications and may be made thereto without departing from the spirit and scope of the invention and should not be construed as limiting the scope of the invention. The scope of the invention, therefore, should be determined with respect to the appended claims, including the full scope of equivalents thereof.

The invention claimed is:

1. A method for fabricating a semiconductor device on a semiconductor substrate doped with a first conductivity, said method comprising:
    forming on said substrate a plurality of spaced-apart active trenches in an active area, and a plurality of spaced-apart termination trenches in a termination area, said plurality of termination trenches comprising at least an innermost termination trench adjacent the active area and an outermost termination trench most distanced away from the active area;
    forming in each of said trenches an insulated gate region;
    removing an outer portion of said insulated gate region adjacent the termination area from the innermost termination trench adjacent the active area while maintaining said insulated gate region in each of the active trenches;
    forming an insulative layer on top of the substrate and filling the outer portion of insulated gate region removed in the innermost termination trench; and
    forming electrical contacts through the insulative layer on top of the substrate.

2. The method as recited in claim 1 further comprising implanting a body dopant and a source dopant into an upper portion of the substrate throughout the entire active area and termination area without a mask before removing the outer portion of insulated gate region in the innermost termination trench, said body dopant having a second conductivity opposite the first conductivity and said source dopant having a first conductivity.

3. The method as recited in claim 2 wherein forming electrical contacts further includes electrically connecting the insulated gate region in the outermost termination trench away from the active area to a body dopant region next to the outermost termination trench but further away from the active area.

4. The method as recited in claim 2 wherein a lower portion of each active trenches and termination trenches is filled with an electrically conductive material surrounded by an electrically insulative material, wherein forming in each trench an insulated gate region further includes forming the insulated gate in an upper portion of each trench in superimposition with said electrically conductive material, with a portion of said electrically insulative material being disposed therebetween.

5. The method as recited in claim 4 wherein removing the outer portion of said insulated gate region adjacent the termination area from the innermost termination trench further includes removing all of said insulated gate region from the outermost termination trench.

6. The method as recited in claim 5 wherein forming electrical contacts further includes electrically connecting the electrically conductive material surrounded by the electrically insulative material filling the lower portion of the outermost termination trench away from the active area to a body dopant region next to the outmost termination trench but further away from the active area.

7. The method as recited in claim 5 wherein removing the outer portion of said insulated gate adjacent the termination area from the innermost termination trench further includes removing a top portion of the substrate in the termination area at least down to a bottom of the insulated gate region.

8. The method as recited in claim 7 wherein forming electrical contacts further includes electrically connecting the electrically conductive material surrounded by the electrically insulative material, filling the lower portion of the outermost termination trench away from the active area to a substrate region next to the outmost termination trench.

9. A method for fabricating a semiconductor device on a semiconductor substrate doped with a first conductivity type, said method comprising:
  forming, on said substrate, a plurality of spaced-apart active trenches, in an active area, and a plurality of spaced-apart termination trenches, in a termination area, with said plurality of termination trenches including an innermost termination trench positioned adjacent to the active area, and an outermost termination trench, spaced-apart from the active area;
  forming in each of the plurality of spaced-apart active trenches and the termination trenches an insulated gate region;
  removing, from the innermost termination trench, a sub-portion of said insulated gate region located adjacent to the termination area, exposing an outer portion of said innermost termination trench, while maintaining the insulated gate region in each of the active trenches;
  forming an insulative layer on top of the substrate and filling the outer portion; and
  forming electrical contacts through the insulative layer.

10. The method as recited in claim 9 wherein forming electrical contacts further includes electrically connecting the insulated gate region of the outermost termination trench to a body dopant region located proximate to the outermost termination trench.

11. The method as recited in claim 9 further including partially filling the active trenches and the termination trenches with an electrically conductive material, wherein forming in the active and termination trenches an insulated gate region further includes forming the insulated gate in superimposition with said electrically conductive material.

12. The method as recited in claim 11 wherein removing the outer portion of the insulated gate region further includes removing the insulated gate region from the outermost termination trench.

13. The method as recited in claim 12 wherein forming electrical contacts further includes electrically connecting the electrically conductive material to a body dopant region proximate to the outermost termination trench.

14. The method as recited in claim 12 wherein removing the outer portion of the insulated gate adjacent the termination area from the innermost termination trench further includes removing a top portion of the substrate in the termination area.

15. The method as recited in claim 14 wherein forming electrical contacts further includes electrically connecting the electrically conductive material surrounded by the electrically insulative material to a substrate region located proximate the outmost termination trench.

16. A method for fabricating a semiconductor device on a semiconductor substrate doped with a first conductivity type, said method comprising:
  forming, on said substrate, a plurality of spaced-apart active trenches, in an active area, and a plurality of spaced-apart termination trenches, in a termination area, with the plurality of termination trenches including an innermost termination trench positioned adjacent to the active area, and an outermost termination trench, spaced-apart from the active area;
  forming in each of the plurality of spaced-apart active trenches and the termination trenches an insulated gate region;
  removing, from the innermost termination trench, a sub-portion of said insulated gate region located adjacent to the termination area, exposing an outer portion of said innermost termination trench, while maintaining the insulated gate region in each of the active trenches;
  forming an insulative layer on top of the substrate and filling the outer portion;
  forming electrical contacts through the insulative layer; and
  implanting a body dopant and a source dopant into an upper portion of the substrate throughout the active area and termination area.

17. The method as recited in claim 16 wherein forming electrical contacts further includes electrically connecting the insulated gate region of the outermost termination trench to a body dopant region located proximate to the outermost termination trench.

18. The method as recited in claim 16 further including partially filling a lower portion of each of the active trenches and the termination trenches with an electrically conductive material, wherein forming in each of the active trenches and the termination trenches further includes forming the insulated gate in each of the active trenches in superimposition with the electrically conductive material.

19. The method as recited in claim 16 wherein removing the outer portion of said insulated gate region adjacent the termination area from the innermost termination trench further includes removing the insulated gate region from the outermost termination trench.

20. The method as recited in claim 19 wherein forming electrical contacts further includes electrically connecting the electrically conductive material surrounded by the electrically insulative material of the outermost termination trench to a body dopant region located proximate to outmost termination trench.

21. The method as recited in claim 19 wherein removing the outer portion of the insulated gate adjacent the termination area from the innermost termination trench further includes removing a top portion of the substrate in the termination area.

* * * * *